US010083657B2

United States Patent
Kim et al.

(10) Patent No.: US 10,083,657 B2
(45) Date of Patent: Sep. 25, 2018

(54) ULTRA HIGH DENSITY DISPLAY HAVING HIGH APERTURE RATIO

(71) Applicant: LG DISPLAY CO., LTD., Seoul (KR)

(72) Inventors: Hyunjin Kim, Paju-si (KR); Seonghwan Hwang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/784,805

(22) Filed: Oct. 16, 2017

(65) Prior Publication Data

US 2018/0114485 A1 Apr. 26, 2018

(30) Foreign Application Priority Data

Oct. 25, 2016 (KR) ........................ 10-2016-0139548

(51) Int. Cl.
  *H01L 27/32* (2006.01)
  *G09G 3/3233* (2016.01)
  *H01L 51/52* (2006.01)

(52) U.S. Cl.
  CPC ....... *G09G 3/3233* (2013.01); *H01L 27/3262* (2013.01); *H01L 27/3276* (2013.01); *H01L 51/5209* (2013.01); *G09G 2300/0426* (2013.01); *G09G 2300/0465* (2013.01); *G09G 2300/0819* (2013.01); *G09G 2320/043* (2013.01); *H01L 2251/5392* (2013.01); *H01L 2251/568* (2013.01)

(58) Field of Classification Search
  None
  See application file for complete search history.

(56) References Cited

U.S. PATENT DOCUMENTS

| 9,147,723 B1 | 9/2015 | Lee et al. | |
|---|---|---|---|
| 2007/0114530 A1 | 5/2007 | Kimura | |
| 2008/0030433 A1* | 2/2008 | Chen | H01L 27/3276 345/76 |
| 2009/0153047 A1* | 6/2009 | Kim | H01L 27/3276 313/506 |
| 2015/0255523 A1* | 9/2015 | Her | H01L 27/3262 345/76 |
| 2016/0049454 A1 | 2/2016 | Park et al. | |

(Continued)

*Primary Examiner* — Alexander Ghyka
(74) *Attorney, Agent, or Firm* — Seed IP Law Group LLP

(57) ABSTRACT

The present disclosure relates to an ultra high density display having high aperture ratio. The present disclosure suggests a display comprising: a upper horizontal current line, a horizontal sensing line, a scan line and a lower horizontal current line running in horizontal direction and sequentially disposed in vertical direction on a substrate in this order from the upper side to the lower side; an emission area defined between the horizontal sensing line and the upper horizontal current line; a non-emission area defined between the horizontal sensing line and the lower horizontal current line; a switching thin film transistor and a sensing thin film transistor disposed between the horizontal sensing line and the scan line; a driving thin film transistor disposed between the scan line and the lower horizontal current line; an anode electrode expanded from the emission area to the non-emission area, and connected to the driving thin film transistor; and an anode bottle neck part disposed between the horizontal sensing line and the scan line for disconnecting the anode electrode from the driving thin film transistor selectively.

13 Claims, 7 Drawing Sheets

(56) References Cited

U.S. PATENT DOCUMENTS

| | | | | |
|---|---|---|---|---|
| 2016/0071916 A1* | 3/2016 | Kim | ................... | H01L 27/3248 |
| | | | | 257/40 |
| 2016/0225883 A1* | 8/2016 | Hong | ............... | H01L 29/66969 |
| 2016/0379571 A1* | 12/2016 | Kim | ................... | G09G 3/3233 |
| | | | | 345/215 |
| 2017/0154941 A1* | 6/2017 | Oh | ................... | H01L 27/3262 |
| 2017/0294159 A1* | 10/2017 | Lee | ................... | G09G 3/3233 |

* cited by examiner

ULTRA HIGH DENSITY DISPLAY HAVING HIGH APERTURE RATIO

CROSS-REFERENCE TO RELATED APPLICATIONS

This application claims the benefit of Korea Patent Application No. 10-2016-0139548, filed Oct. 25, 2016, which is incorporated herein by reference for all purposes as if fully set forth herein.

BACKGROUND

Technical Field

The present disclosure relates to an ultra high density display having high aperture ratio. Especially, the present disclosure relates to an ultra high density organic light emitting diode display having a bottle neck part for darkening a defected pixel as well as having the maximized aperture ratio in the pixel area.

Description of the Related Art

Nowadays, various displays (or "FPD") are developed for overcoming many drawbacks of the cathode ray tube (or "CRT") which is heavy and bulky. The display devices include the liquid crystal display device (or "LCD"), the field emission display (FED), the plasma display panel (or "PDP"), the electro-luminescence device (or "EL") and so on.

As a self-emitting display device, the electro-luminescence device has the merits that the response speed is very fast, the brightness is very high and the view angle is large. The electro-luminescence device can be categorized an inorganic light emitting diode display and an organic light emitting diode (or "OLED") display. As having the good energy efficiencies, the lower leaked current and the easiness for representing color and brightness by current controlling, the OLED display using the organic light emitting diode is more required.

FIG. 1 is a diagram illustrating the structure of the organic light emitting diode. As shown in FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL.

The organic light emitting diode radiates the lights due to the energy from the exciton formed at the excitation state in which the hole from the anode and the electron from the cathode are recombined at the emission layer EML. The organic light emitting diode display can represent the video data by controlling the amount (or "brightness") of the light generated and radiated from the emission layer EML of the organic light emitting diode as shown in FIG. 1.

The OLED display using the organic light emitting diode having the good energy efficiencies can be categorized into the passive matrix type organic light emitting diode (or PMOLED) display and the active matrix type organic light emitting diode (or AMOLED) display.

The active matrix type organic light emitting diode (or AMOLED) display represents the video data by controlling the current applying to the organic light emitting diode using the thin film transistor (or TFT). Hereinafter referring to FIGS. 2 and 3, we will explain about the organic light emitting diode display according to the related art.

FIG. 2 is the exemplary circuit diagram illustrating the structure of one pixel in the active matrix organic light emitting diode (or AMOLED) display. FIG. 3 is a plane view illustrating the structure of the AMOLED according to the related art. FIG. 4 is a cross sectional view along the cutting line I-I' for illustrating the structure of the bottom emission type AMOLED according to the related art.

Referring to FIGS. 2 and 3, the one pixel of the active matrix organic light emitting diode display comprises a switching thin film transistor ST, a driving thin film transistor DT connected to the switching thin film transistor ST, and an organic light emitting diode OLE connected to the driving thin film transistor DT. By depositing a scan line SL, a data line DL and the driving current line VDD on a substrate, a pixel area is defined. As an organic light emitting diode is disposed within the pixel area, it defines an emission area.

The switching thin film transistor ST is formed where the scan line SL and the data line DL is crossing. The switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT acts for driving an anode electrode ANO of the organic light emitting diode OLE disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE. Between the anode electrode ANO and the cathode electrode CAT, an organic light emitting layer OL is disposed. The base voltage VSS is supplied to the cathode electrode CAT. A storage capacitance Cst is formed between the gate electrode DG of the driving thin film transistor DT and the driving current line VDD or between the gate electrode DG of the driving thin film transistor DT and the drain electrode DD of the driving thin film transistor DT.

Referring to FIG. 4, we will explain about the bottom emission type organic light emitting diode display. On the substrate SUB of the active matrix organic light emitting diode display, the gate electrodes SG and DG of the switching thin film transistor ST and the driving thin film transistor DT, respectively are formed. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the drain contact hole DH penetrating the gate insulator GI. The passivation layer PAS is deposited on the substrate SUB having the switching thin film transistor ST and the driving thin film transistor DT.

The upper surface of the substrate having these thin film transistors ST and DT is not in even and/or smooth conditions, but in uneven and/or rugged conditions having many steps. In order to get best light emitting efficiency, the organic light emitting layer OL would be deposited on an even or planar surface. So, to make the upper surface in planar and even conditions, the over coat layer OC is deposited on the whole surface of the substrate SUB.

Then, on the over coat layer OC, the anode electrode ANO of the organic light emitting diode OLE is formed. Here, the anode electrode ANO is connected to the drain electrode DD of the driving thin film transistor DT through the pixel contact hole PH penetrating the over coat layer OC and the passivation layer PAS.

On the substrate SUB having the anode electrode ANO, a bank BA is formed over the area having the switching thin film transistor ST, the driving thin film transistor DT and the various lines DL, SL and VDD, for defining the light emitting area. The exposed portion of the anode electrode ANO by the bank BA would be the light emitting area. On the organic light emitting layer OL, a cathode electrode CAT is deposited.

A spacer SP is disposed on the substrate SUB having the cathode electrode CAT. It is preferable that the spacer (not shown) is disposed on the bank BA, non-emission area. With the spacer, an en-cap (not shown) is joined on the lower substrate SUB. For attaching the en-cap and the lower substrate SUB, an adhesive layer or adhesion material (not shown) would be deposited there-between.

For the bottom emission type organic light emitting diode display, the lights from the organic light emitting layer OL would be radiated to the lower substrate SUB. Therefore, it is preferable that a color filter CF is disposed between the overcoat layer OC and the passivation layer PAS and the anode electrode ANO includes a transparent conductive material. Further, the cathode electrode CAT preferably includes a metal material having the high reflection property for reflecting the lights from the organic light emitting layer OL to bottom side. In addition, the organic light emitting layer OL and the cathode electrode CAT would be deposited as covering the whole surface of the substrate.

The cathode electrode CAT is supplied with the reference voltage of the organic light emitting diode OLE. For ensuring the stable operation of the organic light emitting diode OLE, the reference voltage should be kept in stable voltage without flickers. To do so, it is preferable that the cathode electrode CAT has the low resistance metal material and is deposited over the whole surface of the substrate SUB.

When the organic light emitting diode display according to the related art is used for a long time, the video quality may be degraded due to the change of the electric characteristics of the pixels. The compensation elements for recovering these defects are required by detecting the changes of the electric characteristics.

In the cases that these compensation elements or circuits are installed into the pixel area, it may cause the reduction of the aperture ratio which is the ratio of the emission area to the pixel area. For the ultra high resolution display including UHD or 4K, the pixel area includes the switching thin film transistor, the driving thin film transistor and the compensation thin film transistor so that the aperture ration is remarkably reduced. It is required that the new structure of the organic light emitting diode display which ensures the high aperture ratio with the ultra high density resolution.

BRIEF SUMMARY

In order to overcome the above mentioned drawbacks, a purpose of the present disclosure is to suggest an ultra high density organic light emitting diode display having a high aperture ratio. Another purpose of the present disclosure is to suggest an ultra high density organic light emitting diode display having a high aperture ratio and a bottle neck part for darkening the defected pixel selectively.

In order to accomplish the above purpose, the present disclosure suggests a display comprising: a upper horizontal current line, a horizontal sensing line, a scan line and a lower horizontal current line running in horizontal direction and sequentially disposed in vertical direction on a substrate in this order from the upper side to the lower side; an emission area defined between the horizontal sensing line and the upper horizontal current line; a non-emission area defined between the horizontal sensing line and the lower horizontal current line; a switching thin film transistor and a sensing thin film transistor disposed between the horizontal sensing line and the scan line; a driving thin film transistor disposed between the scan line and the lower horizontal current line; an anode electrode extending from the emission area to the non-emission area, and connected to the driving thin film transistor; and an anode bottle neck part disposed between the horizontal sensing line and the scan line for disconnecting the anode electrode from the driving thin film transistor selectively.

In one embodiment, the sensing thin film transistor includes: a sensing source electrode branching from the horizontal sensing line; a sensing gate electrode defined at a first portion of the scan line; a sensing drain electrode facing the sensing source electrode with the sensing gate electrode at the center; a sensing semiconductor layer extending from the sensing source electrode to the sensing drain electrode, and overlapping with the sensing gate electrode; and a sensing bottle neck part disposed between the horizontal sensing line and the scan line for disconnecting the sensing source electrode from the horizontal sensing line, selectively.

In one embodiment, the anode bottle neck part is running in vertical direction between the horizontal sensing line and the scan line, and connects a first portion of the anode electrode disposed at the emission area to a second portion of the anode electrode disposed at the non-emission area.

In one embodiment, the sensing bottle neck part has a segment shape being apart from the horizontal sensing line and the anode bottle neck part with 6 µm at least.

In one embodiment, the horizontal sensing line is connected to a vertical sensing line through a sensing contact hole exposing a portion of the sensing line.

In one embodiment, the display further comprises: a data line, a driving current line and a vertical sensing line running in vertical direction on the substrate.

In one embodiment, the switching thin film transistor includes: a switching source electrode branching from the data line; a switching gate electrode defined at a second portion of the scan line; a switching drain electrode facing the switching source electrode with the switching gate electrode at the center; and a switching semiconductor layer extending from the switching source electrode to the switching drain electrode, and overlapping with the switching gate electrode.

In one embodiment, the switching thin film transistor further includes: a switching bottle neck part disposed between the data line and the switching source electrode.

In one embodiment, the driving thin film transistor includes: a driving gate electrode connected to the switching thin film transistor; a driving source electrode defined at a portion of the driving current line; a driving drain electrode facing the driving source electrode with the driving gate electrode at the center; and a driving semiconductor layer extending from the driving source electrode to the driving drain electrode, and overlapping with the driving gate electrode.

In one embodiment, the upper and lower horizontal current lines are connected to the driving current line through a current contact hole exposing a portion of the driving current line.

The organic light emitting diode display according to the present disclosure includes a compensation thin film transistor for controlling the conditions of the driving thin film transistor and/or the organic light emitting diode by detecting the degradation of the pixel. Under the hard condition causing the deterioration of the pixel, the video quality can be kept in superior quality. Further, it has a bottle neck portion in the pixel by which the pixel would be the defected pixel when any pixel has the irrecoverable defects during the manufacturing process (so it is called as the "darkened pixel"). Having an element for making unavailable the defected pixel in the ultra high density organic light emitting diode display, the manufacturing yield may be increased. In the organic light emitting diode display according to the present disclosure, the bottle neck portion for darkening the defected pixel is located at the non-emission area, so that the aperture ratio can be maximized. According to the present disclosure, the maximum aperture ratio can be ensured in the UHD rate ultra high resolution organic light emitting diode display having the compensation elements.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

In the drawings.

DETAILED DESCRIPTION

Figure 1:
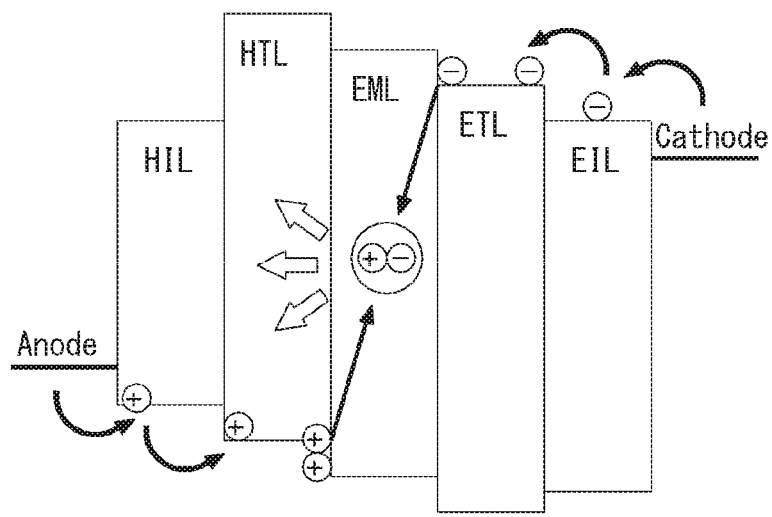
FIG. 1 is a diagram illustrating the structure of the organic light emitting diode according to the related art.
Figure 2:
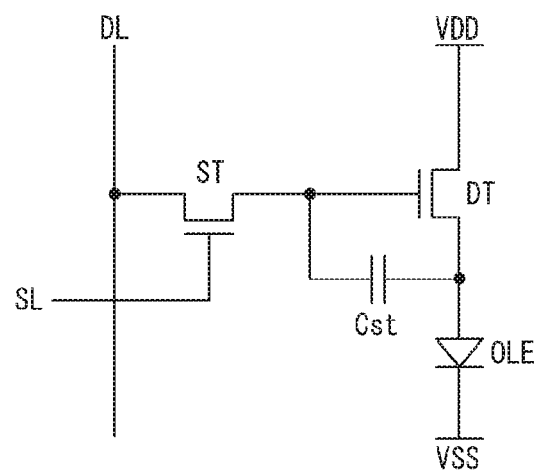
FIG. 2 is the exemplary circuit diagram illustrating the structure of one pixel in the active matrix organic light emitting diode (or AMOLED) display according to the related art.
Figure 3:
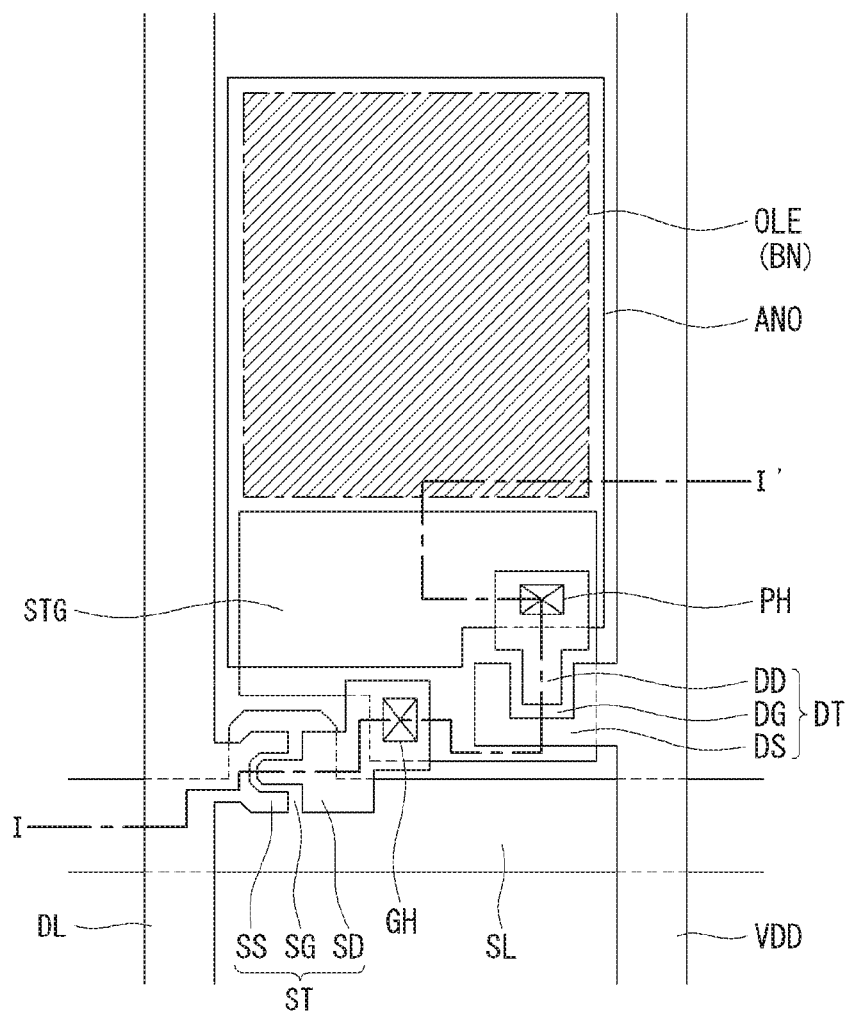
FIG. 3 is a plane view illustrating the structure of one pixel in the AMOLED display according to the related art.
Figure 4:
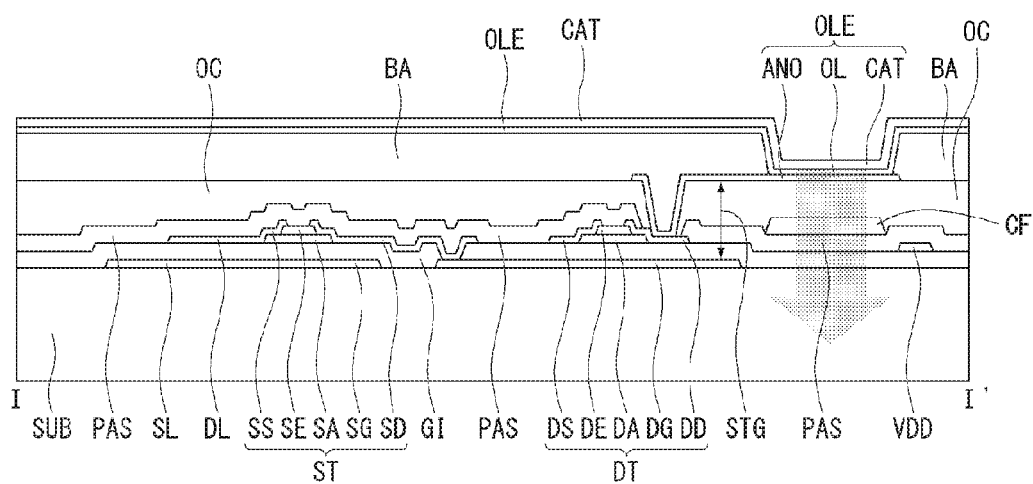
FIG. 4 is a cross sectional view along the cutting line I-I' for illustrating the structure of the bottom emission type AMOLED according to the related art.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 5:
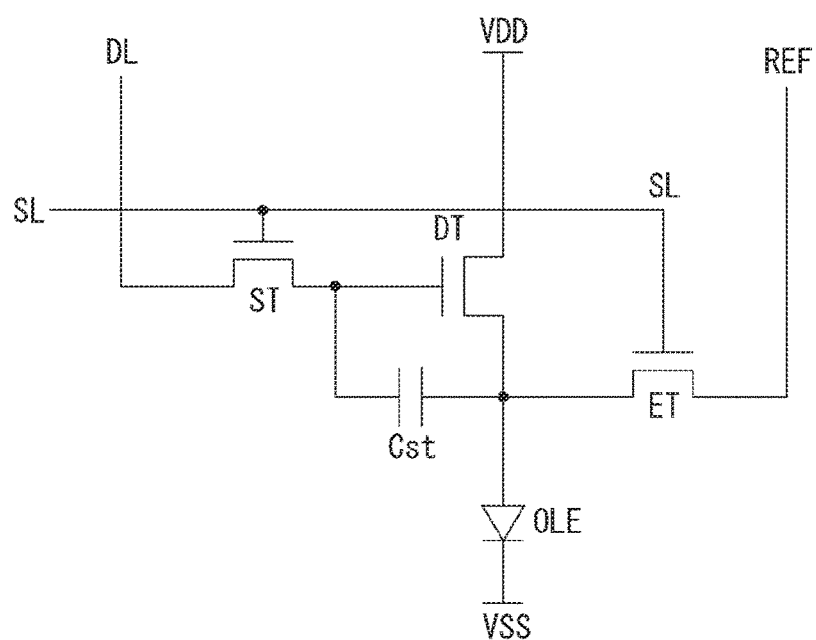
FIG. 5 is an equivalent circuit diagram illustrating a structure of one pixel in the organic light emitting diode display having a compensation element according to the present disclosure.

Hereinafter, referring to FIG. 5, we will explain about the present disclosure. FIG. 5 is an equivalent circuit diagram illustrating a structure of one pixel in the organic light emitting diode display having a compensation element according to the present disclosure.

Referring to FIG. 5, one pixel of the organic light emitting diode display comprises a switching thin film transistor ST, a driving thin film transistor DT, a storage capacitance Cst, a compensation element and an organic light emitting diode OLE. The compensation element may be configured in a various method. Here, we explain about the case that the compensation element includes a sensing thin film transistor ET and a sensing line REF.

Responding to the scan signal supplied from the scan line SL, the switching thin film transistor ST performs a switching operation for storing the data signal from the data line DL to the storage capacitance Cst as the data voltage. According to the data voltage in the storage capacitance Cst, the driving thin film transistor DT works for supplying the driving current between the driving current line VDD (supplying the variable high level voltage) and the base voltage line VSS (supplying the constant low level voltage). The organic light emitting diode OLE works for generating the lights according to the driving current formed by the driving thin film transistor DT.

The sensing thin film transistor ET is an additional element disposed within the pixel area for compensating the threshold voltage of the driving thin film transistor DT. The sensing thin film transistor ET is connected between the drain electrode of the driving thin film transistor DT and the anode electrode (or the sensing node) of the organic light emitting diode OLE. The sensing thin film transistor ET works for supplying the initial voltage (or the sensing voltage) from the sensing line REF to the sensing node or for detecting (or sensing) the voltage or current at the sensing node.

The switching thin film transistor ST includes a source electrode connected to the data line DL, and a drain electrode connected to the gate electrode of the driving thin film transistor DT. The driving thin film transistor DT includes a source electrode connected to the driving current line VDD, and a drain electrode connected to anode electrode of the organic light emitting diode OLE. The storage capacitance Cst includes a first electrode connected to the gate electrode of the driving thin film transistor DT, and a second electrode connected to the anode electrode of the organic light emitting diode OLE.

The organic light emitting diode OLE includes an anode electrode connected to the drain electrode of the driving thin film transistor DT, and a cathode electrode connected to the base voltage line VSS. The sensing transistor ET includes a source electrode connected to the sensing line REF, and a drain electrode connected to the sensing node (the anode electrode of the organic light emitting diode OLE).

The operating timing of the sensing thin film transistor ET may be related to that of the switching thin film transistor ST according to the compensation algorithm. For example, as shown in FIG. 5, the gate electrodes of the switching thin film transistor ST and the sensing thin film transistor ET may be connected to the scan line SL commonly. Otherwise, the gate electrode of the switching thin film transistor ST is connected to one scan line SL and the gate electrode of the sensing thin film transistor ET is connected to the other scan line (not shown).

According to the sensing results, the digital type data signal, the analog type data signal or gamma signal may be compensated. The compensation elements for generating the compensating signal (or the compensating voltage) based on the sensing results may be configured as the internal circuits embedded into the data driver or timing controller or the external circuits.

FIG. 5 shows a pixel having the structure of 3T1C (three thin film transistor and one capacitance) including the switching thin film transistor ST, the driving thin film transistor DT, the sensing thin film transistor ET, the storage capacitance Cst and the organic light emitting diode OLE. Otherwise, the pixel may include additional compensating elements for example, 3T2C, 4T2C, 5T1C, 6T2C etc.

Hereinafter, we will explain about the structural features of the ultra high resolution organic light emitting diode display configured with the circuit diagram shown in FIG. 5 according to the present disclosure. In accordance with the real structure of the pixel, the aperture ratio may be different. As the degree of the resolution, the aperture ratio is very important for deciding the quality of the display. As the resolution of the display is increasing, the unit pixel area is getting smaller. The size of the thin film transistors and the width of the lines cannot be made small indefinitely. As the pixel area is smaller, the ratio of the emission area in the pixel area is smaller.

Further, when the compensating element is included into the pixel area, the aperture ratio, the ratio of the emission area to the pixel area, is much smaller. In addition, as the number of the pixels is increasing, the probability of the defected pixel is also increasing. The defected pixel is the main causes of the deterioration of the video quality. Therefore, it is preferable that the defected pixels are to be darkened so that the normal pixels are not affected by the defected pixels. For darkening the defected pixels, it is preferable to cut the connecting part between the thin film transistor and the organic light emitting diode. Hereinafter, we will explain about various structures of the organic light emitting diode display according to the present disclosure.

First Embodiment

Figure 6:
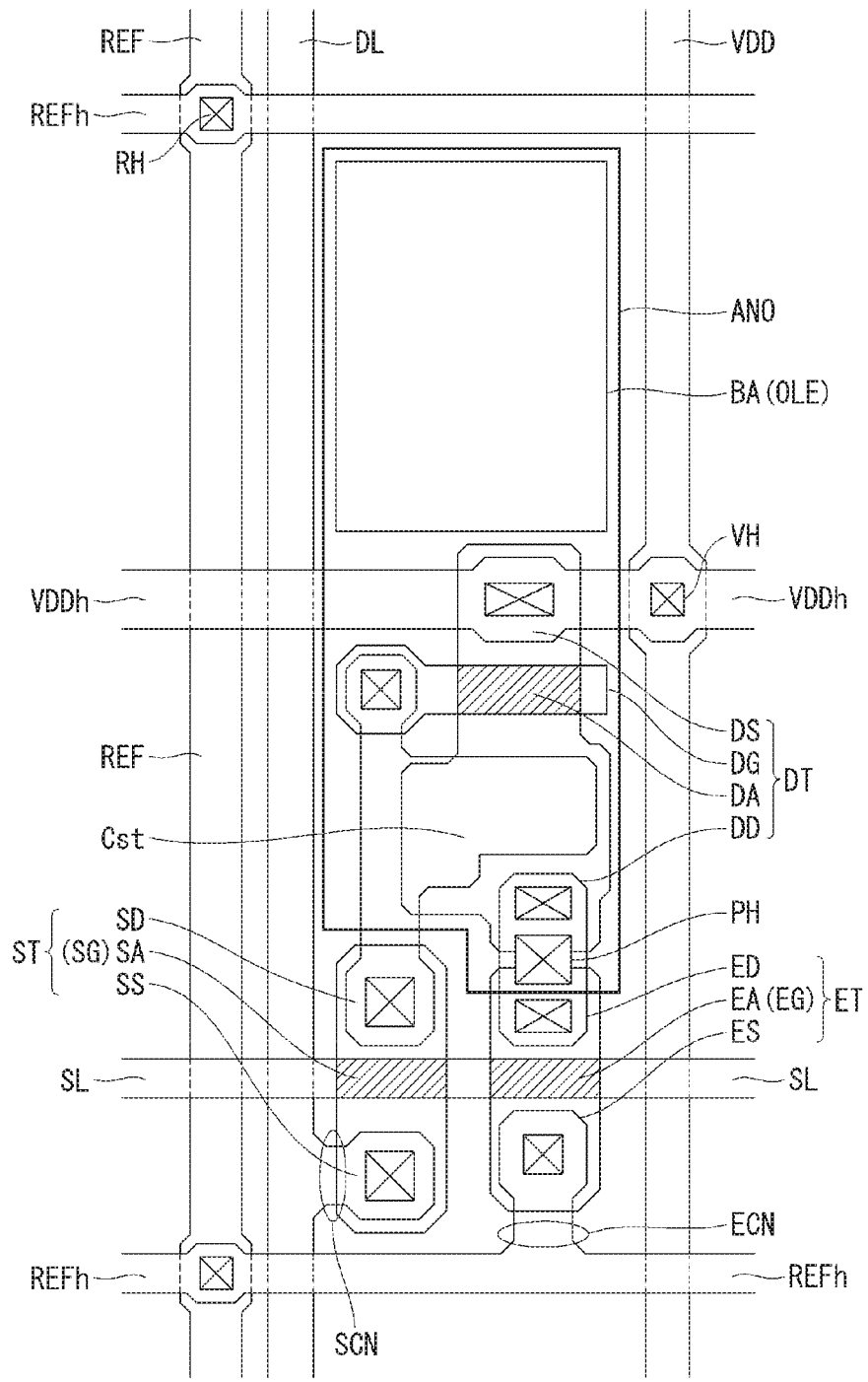
FIG. 6 is a plane view illustrating a structure of one pixel in an organic light emitting diode display having a compensation element according to the first embodiment of the present disclosure.

Referring to FIG. 6, we will explain about the first embodiment of the present disclosure. FIG. 6 is a plane view illustrating a structure of one pixel in an organic light emitting diode display having a compensation element according to the first embodiment of the present disclosure.

The organic light emitting diode display according to the first embodiment of the present disclosure comprises a sensing line REF, a data line DL, a driving current line VDD, a horizontal sensing line REFh, a horizontal current line VDDh and a scan line SL on a substrate SUB. These lines define a pixel area. In detail, a unit pixel area is defined as an area surrounded by two neighboring horizontal sensing lines REFh, one data line DL and one driving current line VDD.

The scan line SL, the horizontal sensing line REFh and the horizontal current line VDDh are running in horizontal direction on the substrate SUB. The data line DL, the driving current line VDD and the sensing line REF are running in vertical direction on the substrate SUB. The horizontal sensing line REFh is connected to the sensing line REF via a sensing contact hole RH. The horizontal current line VDDh is connected to the driving current line VDD via the current contact hole VH.

Between two neighboring horizontal sensing line REFh, the horizontal current line VDDh and the scan line SL are disposed. The area between the upper horizontal sensing line REFh and the horizontal current line VDDh is defined as the emission area. The area between the horizontal current line VDDh and the lower horizontal sensing line REFh is defined as the non-emission area. In the emission area, an organic light emitting diode OLE is disposed. In the non-emission area, the thin film transistors ST, DT and ET and the storage capacitance Cst are disposed.

The switching thin film transistor ST includes a switching source electrode SS connected to the data line DL, a switching gate electrode SG defined at a part of the scan line SL, a switching semiconductor layer SA and a switching drain electrode SD. A channel area is defined at the overlapped area of the switching semiconductor layer SA with the switching gate electrode SG. As the switching semiconductor layer SA is disposed as crossing the scan line SL from the lower side to the upper side, the switching thin film transistor ST is formed.

The sensing thin film transistor ET includes a sensing source electrode ES connected to the lower horizontal sensing line REFh, a sensing gate electrode EG defined at a part of the scan line SL, a sensing semiconductor layer EA and a sensing drain electrode ED. A channel area is defined at the overlapped area of the sensing semiconductor layer EA with the sensing gate electrode EG. As the sensing semiconductor layer EA is disposed as crossing the scan line SL from the lower side to the upper side, the sensing thin film transistor ET is formed.

The driving thin film transistor DT includes a driving source electrode DS defined at a part of the horizontal current line VDDh, a driving gate electrode DG connected to the switching drain electrode SD, a driving semiconductor layer DA and a driving drain electrode DD. A channel area is defined at the overlapped area of the driving semiconductor layer DA with the driving gate electrode DG. As the driving semiconductor layer DA is disposed as crossing the driving gate electrode DG from the horizontal current line VDDh to the scan line SL, the driving thin film transistor DT is formed. The driving drain electrode DD is connected to the one portion of the driving semiconductor layer DA and one portion of the sensing semiconductor layer EA.

The storage capacitance Cst includes a first electrode and a second electrode. The first electrode is formed as some expanded portions of the switching drain electrode SD. The second electrode is formed as some expanded portions of the driving semiconductor layer DA to the scan line SL over the driving gate electrode DG.

The driving thin film transistor DT and the storage capacitance Cst are disposed between the horizontal current line VDDh and the scan line SL. The driving elements including the thin film transistors ST, DT and ET and the storage capacitance Cst are disposed between the horizontal current line VDDh and the lower horizontal sensing line REFh. This area is defined as the non-emission area.

The anode electrode ANO of the organic light emitting diode OLE is connected to the driving drain electrode DD through the pixel contact hole PH. The open area of the bank BA is defined as exposing a maximum area of the anode electrode ANO. As ensuring the maximum area, the anode electrode ANO is occupying the emission area and some portions are expanded to the non-emission area. Specifically, it is preferable that the anode electrode ANO expands to the driving drain electrode DD. Further, the anode electrode ANO may be overlapped with the storage capacitance Cst. When it is hard to form the second electrode of the storage capacitance Cst with the driving semiconductor layer DA, the second electrode of the storage capacitance Cst may be formed by expanding the anode electrode ANO as overlapping with the first electrode.

Most parts of the anode electrode ANO are exposed by the bank BA. The organic light emitting diode OLE is formed by stacking the organic light emitting layer and the cathode electrode on the bank BA. It is preferable that the organic light emitting diode OLE is formed as having the maximum emission area within the pixel area.

The organic light emitting diode display shown in FIG. 6 has the structure having the compensation elements. With this structure, when any one pixel is defected, the connection between anode electrode ANO and the thin film transistors is cut or disconnected. For example, the source electrode SS of the switching thin film transistor ST is disconnected from the data line DL. Further, the source electrode ES of the sensing thin film transistor ET is disconnected from the lower horizontal sensing line REFh.

In order that the darkening process is conducted when any defected pixels are founded, it is preferable that a switching bottle neck part SCN is disposed between the switching source electrode SS and the data line DL, and a sensing bottle neck part ECN is disposed between the sensing gate electrode EG and the lower horizontal sensing line REFh. Theses bottle neck parts SCN and ECN would have the segment shape of which the width is 4.5 µm and the length is 6 µm, at least.

These bottle neck parts SCN and ECN are the parts for being physically cut out or removed using the LASER beam when the pixel is defined as a defected pixel. It is preferable that there are empty spaces around theses bottle neck parts SCN and ECN for preventing interference with other elements. For example, these bottle neck parts SCN and ECN would be apart from all neighboring elements with 6 µm at least. Therefore, it is required some area for disposing these bottle neck parts SCN and ECN within the pixel area. That is, in order to ensure the bottle neck part for darkening process, the aperture ratio would be reduced.

In the organic light emitting diode display as shown in FIG. 6, the bottle neck parts do not disconnect the anode electrode ANO of the organic light emitting diode OLE from the thin film transistors directly. In other word, after conducting the darkening process, the anode electrode ANO is still connected to the driving thin film transistor DT. As the results, the organic light emitting diode OLE would be in activated condition by the induced current and/or the induced voltage.

Consequently, even though the organic light emitting diode display having the structure as shown in FIG. 6 has the bottle neck part for darkening process, the defected pixel may not be darkened perfectly. Therefore, new structure of the bottle neck part for perfectly disconnecting the organic light emitting diode OLE from the thin film transistor is required.

Second Embodiment

Figure 7:
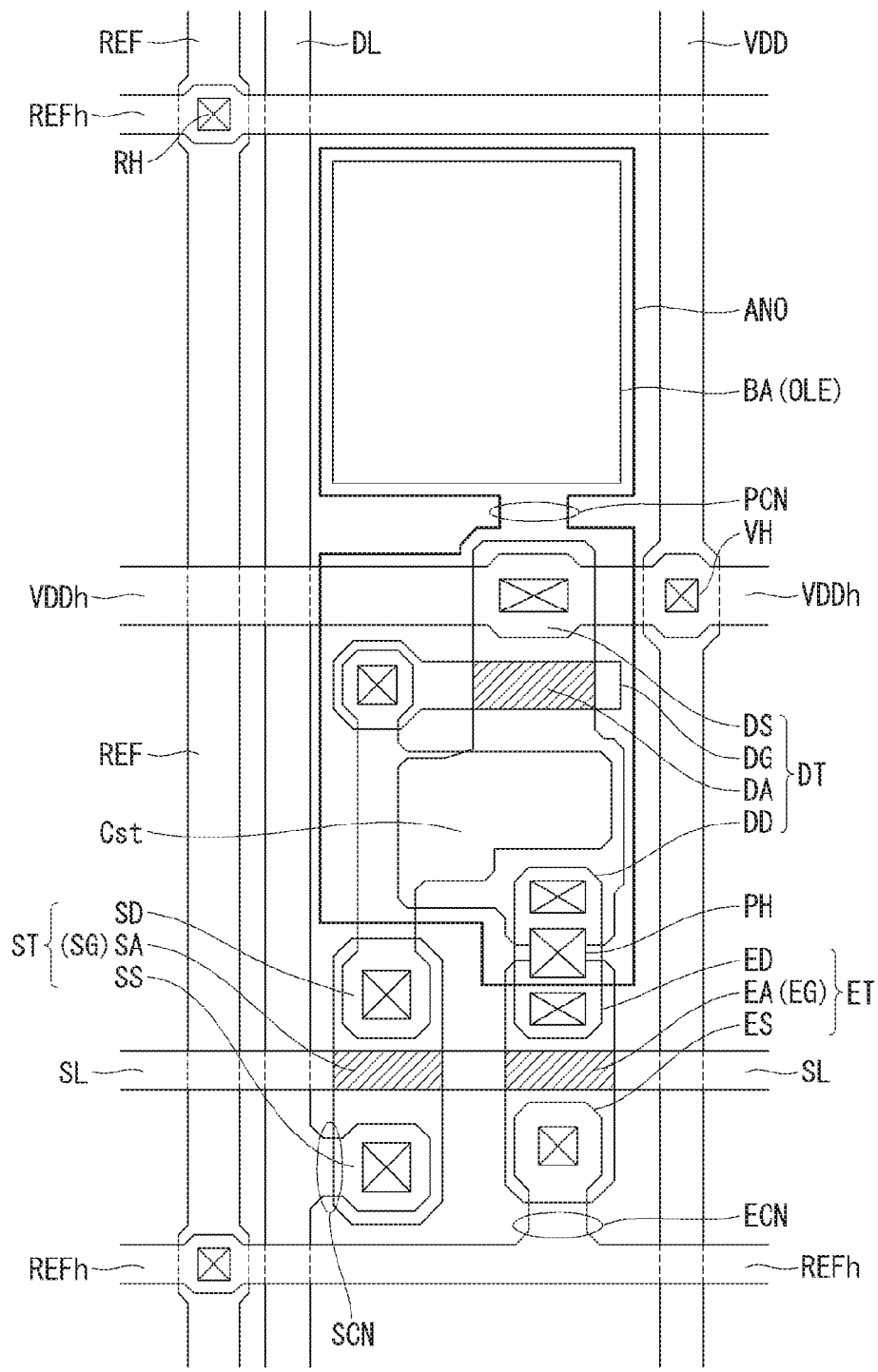
FIG. 7 is a plane view illustrating a structure of one pixel in an ultra high density organic light emitting diode display having a bottle neck portion for darkening a defected pixel according to the second embodiment of the present disclosure.

Hereinafter, referring to FIG. 7 we will explain about an organic light emitting diode display according to the second embodiment in which the organic light emitting diode OLE is disconnected from the thin film transistor. FIG. 7 is a plane view illustrating a structure of one pixel in an ultra high density organic light emitting diode display having a bottle neck portion for darkening a defected pixel according to the second embodiment of the present disclosure.

The organic light emitting diode display according to the second embodiment is very similar with the display according to the first embodiment. The same or similar elements with the first embodiment will not be duplicated. The main difference point is on the structure of the anode electrode ANO.

The anode electrode ANO according to the second embodiment further includes an anode bottle neck part PCN at the lower side of the pixel area. The anode bottle neck part PCN is formed by narrowing the width of some portion of the anode electrode ANO. In other word, the anode bottle neck part PCN has a short and narrow segment shape linking the major portions of the anode electrode ANO disposed at the emission area to the minor portions of the anode electrode ANO disposed at the non-emission area.

The gap between the anode bottle neck part PCN and other neighboring elements is preferably No at least like in the first embodiment. For example, it is preferable that the anode bottle neck PCN is apart with 6 µm distance from the horizontal current line VDDh at least. In convenience for cutting process, it is preferable that the anode bottle neck part PCN has the short segment shape of which the width is 4.5 µm and the length is 6 µm, at least.

For disposing the anode bottle neck part PCN, the open area of the anode electrode ANO by the bank BA is smaller than that of the first embodiment. The organic light emitting diode display shown in FIG. 7 includes the anode bottle neck part, so that it is possible to disconnect the anode electrode ANO of the organic light emitting diode OLE from the driving thin film transistor DT physically and electrically. However, the aperture ratio would be lowered for ensuring the anode bottle neck part PCN.

Third Embodiment

Figure 8:
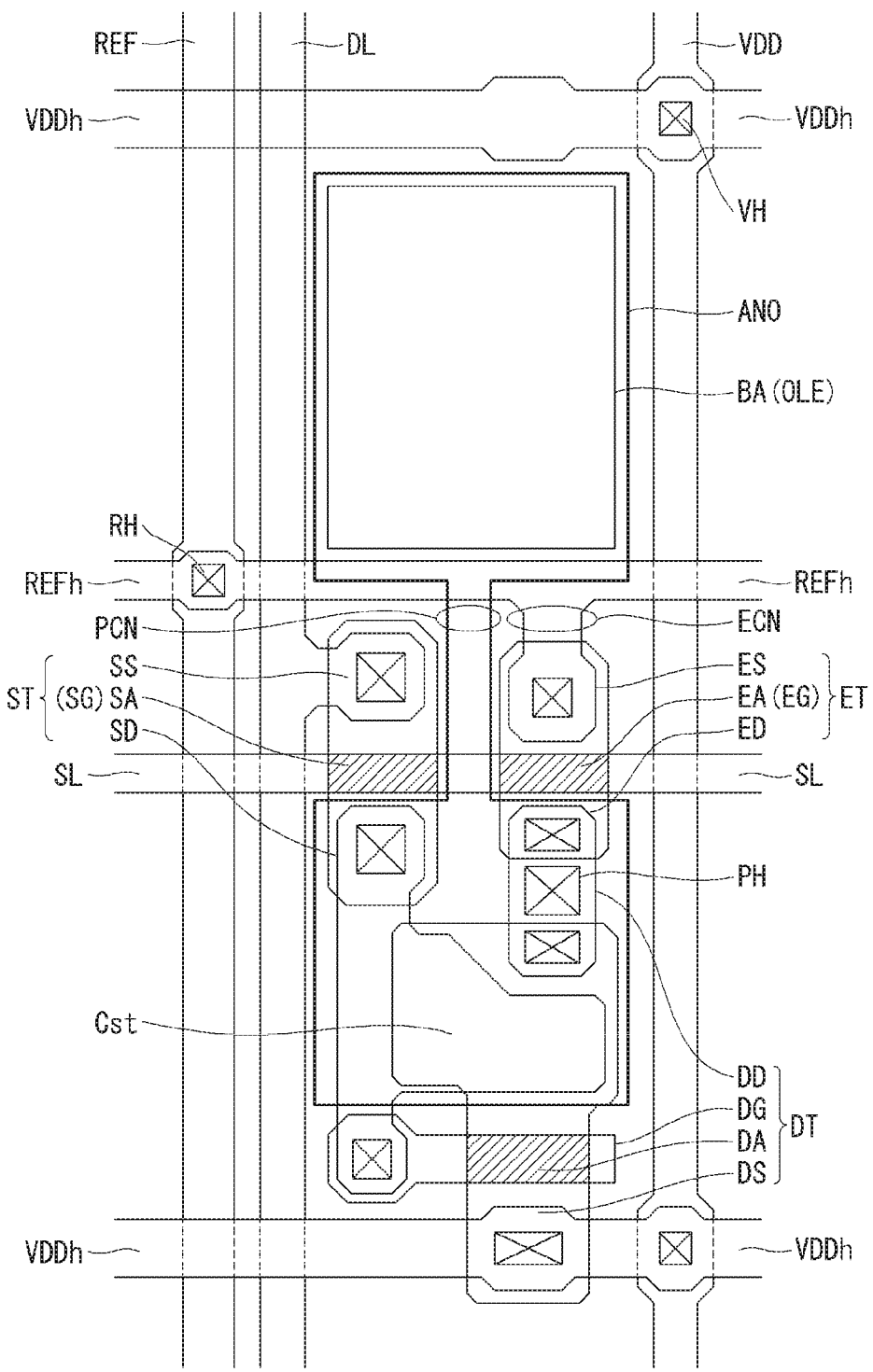
FIG. 8 is a plane view illustrating a structure of one pixel in an ultra high density organic light emitting diode display having a bottle neck portion for darkening a defected pixel according to the third embodiment of the present disclosure.

Hereinafter, in the third embodiment, we will suggest unique structure of the organic light emitting diode display including the bottle neck part for darkening the defected pixel and ensuring the maximized aperture ratio. FIG. 8 is a plane view illustrating a structure of one pixel in an ultra high density organic light emitting diode display having a bottle neck portion for darkening a defected pixel according to the third embodiment of the present disclosure.

The organic light emitting diode display according to the third embodiment of the present disclosure comprises a sensing line REF, a data line DL, a driving current line VDD, a horizontal sensing line REFh, a horizontal current line VDDh and a scan line SL. The pixel is defined by these lines. For example, a space surrounded by two neighboring horizontal current line VDDh, the data line DL and the driving current line VDD is defined as the unit pixel area.

The scan line SL, the horizontal sensing line REFh and the horizontal current line VDDh are running in horizontal direction on the substrate SUB. The data line DL, the driving current line VDD and the sensing line REF are running in vertical direction on the substrate SUB. The horizontal sensing line REFh is connected to the sensing line REF via a sensing contact hole RH. The horizontal current line VDDh is connected to the driving current line VDD via the current contact hole VH.

Between two neighboring two horizontal current lines VDDh, the horizontal sensing line REFh and the scan line SL are disposed. The area between the upper horizontal current line VDDh and the horizontal sensing line REFh is defined as the emission area. The area between the horizontal sensing line REFh and the lower horizontal current line VDDh is defined as the non-emission area. In the emission area, an organic light emitting diode OLE is disposed. In the non-emission area, the thin film transistors ST, DT and ET and the storage capacitance Cst are disposed.

The switching thin film transistor ST includes a switching source electrode SS branched from or connected to the data line DL, a switching gate electrode SG defined at a first portion of the scan line SL, a switching semiconductor layer SA and a switching drain electrode SD. A channel area is defined at the overlapped area of the switching semiconductor layer SA with the switching gate electrode SG. The switching semiconductor layer SA is extended from the switching source electrode SS disposed at the upper side of the scan line SL to the switching drain electrode SD disposed at the lower side of the scan line SL. As the switching semiconductor layer SA is disposed as crossing the switching gate electrode SG, the switching thin film transistor ST is formed.

The sensing thin film transistor ET includes a sensing source electrode ES branched from or connected to the horizontal sensing line REFh, a sensing gate electrode EG defined at a second portion of the scan line SL, a sensing semiconductor layer EA, and a sensing drain electrode ED. A channel area is defined at the overlapped area of the sensing semiconductor layer EA with the sensing gate electrode EG. The sensing semiconductor layer EA is extended from the sensing source electrode ES disposed at the upper side of the scan line SL to the sensing drain electrode ED disposed at the lower side of the scan line SL. As the sensing semiconductor layer EA is disposed as crossing the sensing gate electrode EG, the sensing thin film transistor ET is formed.

The driving thin film transistor DT includes a driving source electrode DS defined at a part of the lower horizontal current line VDDh, a driving gate electrode DG connected to the switching drain electrode SD, a driving semiconductor layer DA and a driving drain electrode DD. The driving drain electrode DD is facing the driving source electrode DS with the driving gate electrode DG in the center. The driving semiconductor layer DA is extended from the lower horizontal current line VDDh to the scan line SL as crossing the driving gate electrode DG. A channel area is defined at the overlapped area of the driving semiconductor layer DA with the driving gate electrode DG. The driving drain electrode DD is connected to the one end portion of the driving semiconductor layer DA and one end portion of the sensing semiconductor layer EA, at the same time.

The storage capacitance Cst includes a first electrode and a second electrode. The first electrode is formed as some expanded portions of the switching drain electrode SD. The second electrode is formed as some expanded portions of the driving semiconductor layer DA to the scan line SL over the driving gate electrode DG.

The driving thin film transistor DT and the storage capacitance Cst are disposed between the lower horizontal current line VDDh and the scan line SL. The driving elements including the thin film transistors ST, DT and ET and the storage capacitance Cst are disposed between the lower horizontal current line VDDh and the horizontal sensing line REFh. This area is defined as the non-emission area.

The anode electrode ANO of the organic light emitting diode OLE is connected to the driving drain electrode DD through the pixel contact hole PH. The open area of the bank BA is defined as exposing a maximum area of the anode electrode ANO. As ensuring the maximum area, the anode electrode ANO is occupying the emission area and some portions are expanded to the non-emission area. Specifically, it is preferable that the anode electrode ANO expands to the driving drain electrode DD. Further, the anode electrode ANO may be overlapped with the storage capacitance Cst. When it is hard to form the second electrode of the storage capacitance Cst with the driving semiconductor layer DA, the second electrode of the storage capacitance Cst may be formed by expanding the anode electrode ANO as overlapping with the first electrode.

Most parts of the anode electrode ANO are exposed by the bank BA. The organic light emitting diode OLE is formed by stacking the organic light emitting layer and the cathode electrode on the bank BA. It is preferable that the organic light emitting diode OLE is formed as having the maximum emission area within the pixel area.

The organic light emitting diode display shown in FIG. 8 has the structure having the compensation elements. With this structure, when any one pixel is defected, the connection between anode electrode ANO and the thin film transistors is cut or disconnected. For example, the anode electrode ANO may be cut out or disconnected from the driving thin film transistor DT, selectively. Further, in order to prevent that the sensing voltage caused at the defected pixel is affected to other neighboring normal pixel, the sensing gate electrode EG of the sensing thin film transistor ET would be cut out or disconnected from the horizontal sensing line REFh, selectively.

In order that the darkening process is conducted when any defected pixels are founded, it is preferable that an anode bottle neck part PCN is disposed between the anode electrode ANO and the driving thin film transistor DT, and a sensing bottle neck part ECN is disposed between the sensing source electrode ES and the horizontal sensing line REFh. It is preferable that these bottle neck parts PCN and ECN would be apart from all neighboring elements with 6 μm at least. Therefore, it is required some area for disposing these bottle neck parts PCN and ECN within the pixel area.

However, in the organic light emitting diode display according to the third embodiment of the present disclosure, the anode bottle neck part PCN is disposed at the same area for disposing the sensing bottle neck part ECN. In detail, these bottle neck parts PCN and ECN are disposed at the area between the horizontal sensing line REFh and the scan line SL. That is, according to the third embodiment, the bottle neck parts PCN and ECN are disposed within the non-emission area. Therefore, the aperture ratio is not affected by the bottle neck parts.

Further, even though not shown in figure, the switching thin film transistor ST may be cut out or disconnected from the data line DL. To do so, a switching bottle neck part SCN may be disposed between the data line DL and the switching source electrode SS. In FIG. 8, the connecting part of the switching source electrode SS to the data line DL is disposed between the horizontal sensing line REFh and the scan line SL. Therefore, the switching bottle neck part SCN is located at the same area for the anode bottle neck part PCN and the sensing bottle neck part ECN. As all bottle neck parts are disposed at the non-emission area, the aperture ratio is not affected (or reduced) by the bottle neck parts.

The organic light emitting diode display according to the third embodiment of the present disclosure comprises the compensating elements with maintaining the maximized aperture ratio. With the main features of the third embodiment, the present disclosure suggests an ultra high density (over 4K rate) organic light emitting diode display having a high aperture ratio.

While the embodiment of the present disclosure has been described in detail with reference to the drawings, it will be understood by those skilled in the art that the disclosure can be implemented in other specific forms without changing the technical spirit or essential features of the disclosure. Therefore, it should be noted that the forgoing embodiments are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display, comprising:
   a first current line extending in a first direction;
   a second current line extending in the first direction;
   a first sensing line extending in the first direction and positioned between the first current line and the second current line;
   a scan line extending in the first direction and positioned between the first sensing line and the second current line;
   an emission area between the first sensing line and the first current line;
   a non-emission area between the first sensing line and the second current line;
   a switching thin film transistor and a sensing thin film transistor disposed between the first sensing line and the scan line;
   a driving thin film transistor disposed between the scan line and the second current line;
   an anode electrode that extends from the emission area to the non-emission area, and is connected to the driving thin film transistor; and
   an anode bottle neck part disposed between the first sensing line and the scan line for selectively disconnecting the anode electrode from the driving thin film transistor.

2. The display according to the claim 1, wherein the sensing thin film transistor includes:
   a sensing source electrode branching from the first sensing line;
   a sensing gate electrode defined at a portion of the scan line;
   a sensing drain electrode facing the sensing source electrode with the sensing gate electrode being between the sensing drain electrode and the sensing source electrode;
   a sensing semiconductor layer extending from the sensing source electrode to the sensing drain electrode, and overlapped with the sensing gate electrode; and
   a sensing bottle neck part disposed between the first sensing line and the scan line for selectively disconnecting the sensing source electrode from the first sensing line.

3. The display according to the claim 1, wherein the anode bottle neck part extends in a second direction between the first sensing line and the scan line, and connects a first portion of the anode electrode disposed at the emission area to a second portion of the anode electrode disposed at the non-emission area.

4. The display according to the claim 2, wherein the sensing bottle neck part has a segment shape being spaced apart from the anode bottle neck part by at least 6 µm.

5. The display according to claim 4, wherein the segment shape of the sensing bottle neck has a length of at least 6 µm.

6. The display according to the claim 1, wherein the first sensing line is connected to a second sensing line through a sensing contact hole, the second sensing line extending in a second direction that is transverse to the first direction.

7. The display according to the claim 1, further comprising:
   a data line, a driving current line and a second sensing line, each of the data line, the driving current line, and the second sensing line extending in a second direction that is transverse to the first direction.

8. The display according to the claim 7, wherein the switching thin film transistor includes:
   a switching source electrode branching from the data line;
   a switching gate electrode defined at a portion of the scan line;
   a switching drain electrode facing the switching source electrode with the switching gate electrode being between the switching drain electrode and the switching source electrode; and
   a switching semiconductor layer extending from the switching source electrode to the switching drain electrode, and overlapping with the switching gate electrode.

9. The display according to the claim 8, wherein the switching thin film transistor further includes:
   a switching bottle neck part disposed between the data line and the switching source electrode.

10. The display according to the claim 7, wherein the driving thin film transistor includes:
    a driving gate electrode connected to the switching thin film transistor;
    a driving source electrode defined at a portion of the second current line and electrically coupled to the driving current line;
    a driving drain electrode facing the driving source electrode with the driving gate electrode being between the driving drain electrode and the driving source electrode; and
    a driving semiconductor layer extending from the driving source electrode to the driving drain electrode, and overlapping with the driving gate electrode.

11. The display according to the claim 7, wherein the first and second current lines are connected to the driving current line through current contact holes that expose portions of the driving current line.

12. A display device, comprising:
- an upper sensing line, a current line, a scan line and a lower sensing line extending in a first direction and sequentially disposed in a second direction on a substrate in this order between an upper side and a lower side of the substrate, the first direction being transverse to the second direction;
- an emission area defined between the upper sensing line and the current line;
- a non-emission area defined between the lower sensing line and the current line;
- a switching thin film transistor and a sensing thin film transistor at least partially disposed between the lower sensing line and the scan line;
- a driving thin film transistor disposed between the scan line and the current line;
- an anode electrode that extends from the emission area to the non-emission area, and is connected to the driving thin film transistor;
- a sensing bottle neck part disposed between the lower sensing line and a source electrode of the sensing thin film transistor for disconnecting the lower sensing line from the source electrode of the sensing thin film transistor selectively; and
- a switching bottle neck part disposed between a data line that extends in the second direction and a source electrode of the switching thin film transistor for disconnecting the data line from the source electrode of the switching thin film transistor selectively.

13. The display device according to the claim 12, further comprising:
- an anode bottle neck part disposed between the upper sensing line and the current line for disconnecting the anode electrode from the driving thin film transistor selectively.

* * * * *